United States Patent [19]

Childers

[11] Patent Number: 4,654,827
[45] Date of Patent: Mar. 31, 1987

[54] HIGH SPEED TESTING OF SEMICONDUCTOR MEMORY DEVICES

[75] Inventor: Jimmie D. Childers, Missouri City, Tex.

[73] Assignee: Texas Instruments Incorporated, Dallas, Tex.

[21] Appl. No.: 640,717

[22] Filed: Aug. 14, 1984

[51] Int. Cl.$^4$ .............................................. G11C 11/40
[52] U.S. Cl. ...................................... 365/201; 371/21
[58] Field of Search .................. 365/201, 233, 189; 371/21, 24, 25

[56] References Cited

U.S. PATENT DOCUMENTS

| | | | |
|---|---|---|---|
| 4,055,754 | 10/1977 | Chesley | 365/201 |
| 4,495,603 | 1/1985 | Varshney | 365/233 |
| 4,541,090 | 9/1985 | Shiragasawa | 365/201 |

OTHER PUBLICATIONS

Rudy, "Memory Word Line Monitor", vol. 19, No. 2, Jul. 1976, p. 499.

Kelley, "Imbedded Memory Test Methods", vol. 21, No. 12, May 1979, pp. 4911-4913.

Primary Examiner—Terrell W. Fears
Attorney, Agent, or Firm—John G. Graham

[57] ABSTRACT

A semiconductor integrated circuit, such as a high-density, dynamic read/write memory containing an array of rows and columns of memory cells, is constructed to allow high speed testing to identify row line faults in one example, and to identify column or sense amplifier faults in another example. Row lines for the array in a dynamic RAM may contain detector circuits activated in a special test mode to produce a data output indicating integrity of each row line without requiring the access of the cells in the array in complex data patterns. The connection between bit lines in the array and sense amplifiers may be shifted or transposed in another embodiment to distinguish between column or sense amplifier faults; this construction also allows rapid loading of test patterns.

12 Claims, 8 Drawing Figures

HIGH SPEED TESTING OF SEMICONDUCTOR MEMORY DEVICES

RELATED CASES

This application discloses subject matter also disclosed in copending applications Ser. No. 626,791, filed July 2, 1984; Ser. No. 630,507, filed July 11, 1984, Ser. No. 634,898, filed July 25, 1984; Ser. No. 634,901 now U.S. Pat. No. 4,618,947, filed July 26, 1984; Ser. No. 636,941, filed Aug. 2, 1984; and Ser. No. 640,716, filed Aug. 14, 1984; all assigned to Texas Instruments.

BACKGROUND OF THE INVENTION

This invention relates to semiconductor devices, and more particularly to circuits for rapid testing of cell arrays and the like in dynamic memory devices.

Dynamic MOS read/write memory devices have been constructed generally as shown in U.S. Pat. No. 4,081,701 (a 16K dynamic RAM) issued to White, McAdams and Redwine, or U.S. Pat. No. 4,239,993 (a 64K dynamic RAM) issued to McAlexander, White and Rao, both assigned to Texas Instruments. When memory devices of this type are manufactured in higher densities, such as 256K and 1-Megabit and beyond, the problem of testing all of the cells and all of the other circuits on the chip becomes formidible.

Dynamic RAMs are tested using a large number of different test patterns which are repeated for all cells of the array, and often each test pattern requires several accesses to each cell. Thus, if the device contains $1-M$ cels then a complete test sequence of the conventianal type may require several hundred million accesses. The time that a given device remains on the test machine becomes a large factor in manufacturing cost.

Additional test time is required if more detailed test data is to be obtained for defect analysis, such as that described in U.S. patent application Ser. No. 604,115 filed Apr. 26, 1984, by White and Zivitz, assigned to Texas Instruments. If the particular type and cause of failure is to be extracted from the test data, rather than merely a "go or no-go", pass or fail outcome, then a lot more test time is needed, beyond the standard sequence of test patterns.

It is the principal object of this invention to provide improved test methods for high density dynamic RAM devices or the like, particularly for determining specific types of failures. Another object is to provide testing circuitry for a dynamic RAM in which the testing time is minimized, yet the circuitry added to the device is minimized. A further object is to provide high speed test circuitry for semiconductor devices which contain arrays of cells and the like.

SUMMARY OF THE INVENTION

In accordance with one embodiment of the invention, a semiconductor circuit, such as a high-density, dynamic read/write memory containing an array of rows and columns of memory cells, is constructed to allow high speed testing to identify row line faults in one example, and to identify column or sense amplifier faults in another example. Row lines for the array in a dynamic RAM may contain detector circuits activated in a special test mode to produce a data output indicating integrity of each row line without requiring the access of the cells in the array in complex data patterns. The connection between bit lines in the array and sense amplifiers may be shifted or transposed in another embodiment to distinguish between column or sense amplifier faults; this construction also allows rapid loading of test patterns.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENT

Figure 1A:
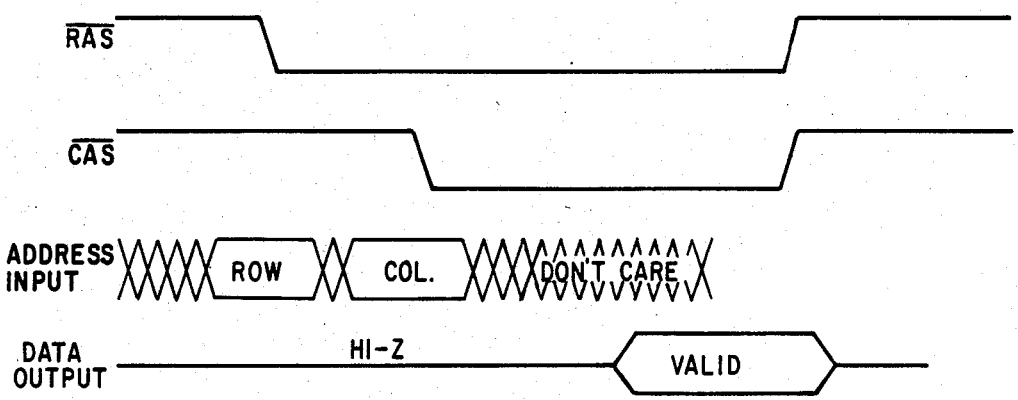
FIG. 1a is a timing diagram of voltages used in operation of the device of FIG. 1.
Figure 1B:
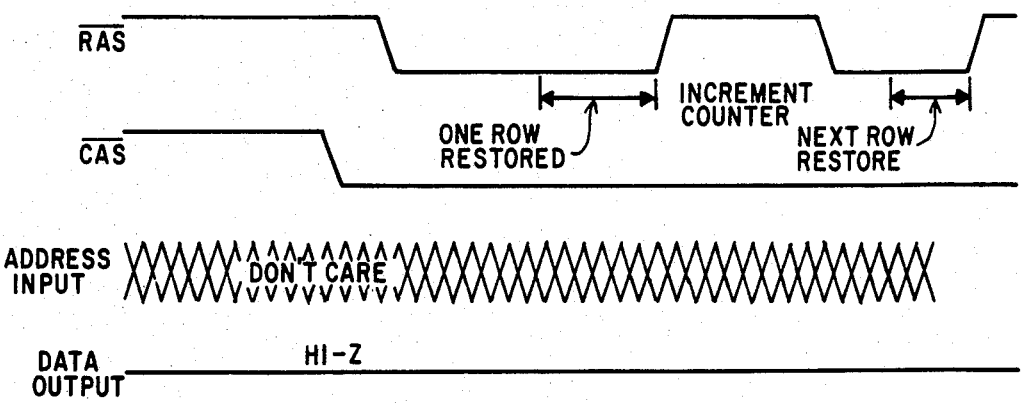
FIG. 1 is an electrical diagram in block form of a dynamic memory device of the 1-Megabit size which may use the testing circuitry of the invention.

Referring to FIG. 1, a block diagram of one example of a semiconductor read/write memory chip is illustrated which may use test circuitry constructed according to the invention. This device is of the so-called 1-Megabit size, having $2^{20}$ or 1,048,576 memory cells in an array of rows and columns. The array is partitioned into four identical blocks 10a, 10b, 10c and 10d, with each block containing 262,144 cells. Within each block, there are 512 row lines, and all row lines are connected to one of the row decoders 11a or 11b. Each row decoder 11a or 11b receives 9-bits of a 10-bit row address from address input pins 12 by way of row address latches 13 (or internally from a refresh counter) and lines 14. The row lines have detector circuits for testing according to one embodiment of the invention, as will be explained. A 10-bit column address is also applied to the input pins 12, in time-multiplexed manner, and this column address is coupled to buffers 15. Eight data I/O lines 16 are positioned in the center of the array, and one of these eight is selected for data input or output by a 1-of-eight selector 17; a single I/O line from this selector 17 is connected through buffers to the data-in pin 18 and the data-out pin 19. The selector 17 receives three bits of the column address by lines 20 from the column address buffers 15. Two of the eight lines 16 are connected respectively to each of the blocks 10a, 10b, 10c and 10d by I/O lines 21. A 2-of-16 column selection is made in each of sixteen sets of sixteen intermediate output buffers 24 in each block 10a–10d, using four bits of the column address on lines 25 from the buffers 15. Each one of the 512 sense amplifiers 26 in each block is connected to one of the columns in the array (each column is made up of two column line halves or "bit lines"). Each buffer 24 is coupled to one of two columns; this selection is base on one bit of the row address from buffers 13 on line 27. The addresed column may be physically transposed to an adjacent column, according to a test mode in another embodiment, as will be explained.

The memory device receives a row address strobe $\overline{RAS}$ on input pin 28, and a column address strobe $\overline{CAS}$ on input pin 29. Selection of a read or a write operation is made by a R/$\overline{W}$ control on an input pin 30. A clock generator and control circuit 31 produces all of the internal clocks and controls as needed. For a single-bit read (or write), $\overline{RAS}$ and $\overline{CAS}$ drop to zero in sequence as illustrated in FIG. 1a, and a one-bit data read (or write) occurs. To initiate a refresh mode, however, the $\overline{CAS}$ voltage drops before $\overline{RAS}$, and an address register within the address buffers 13 is used as the source of the row address.

Each block of the array contains two rows of dummy cells 32 in the usual manner, as discussed in the above-mentioned U.S. Pat. Nos. 4,293,993 or 4,081,701.

Figure 2:
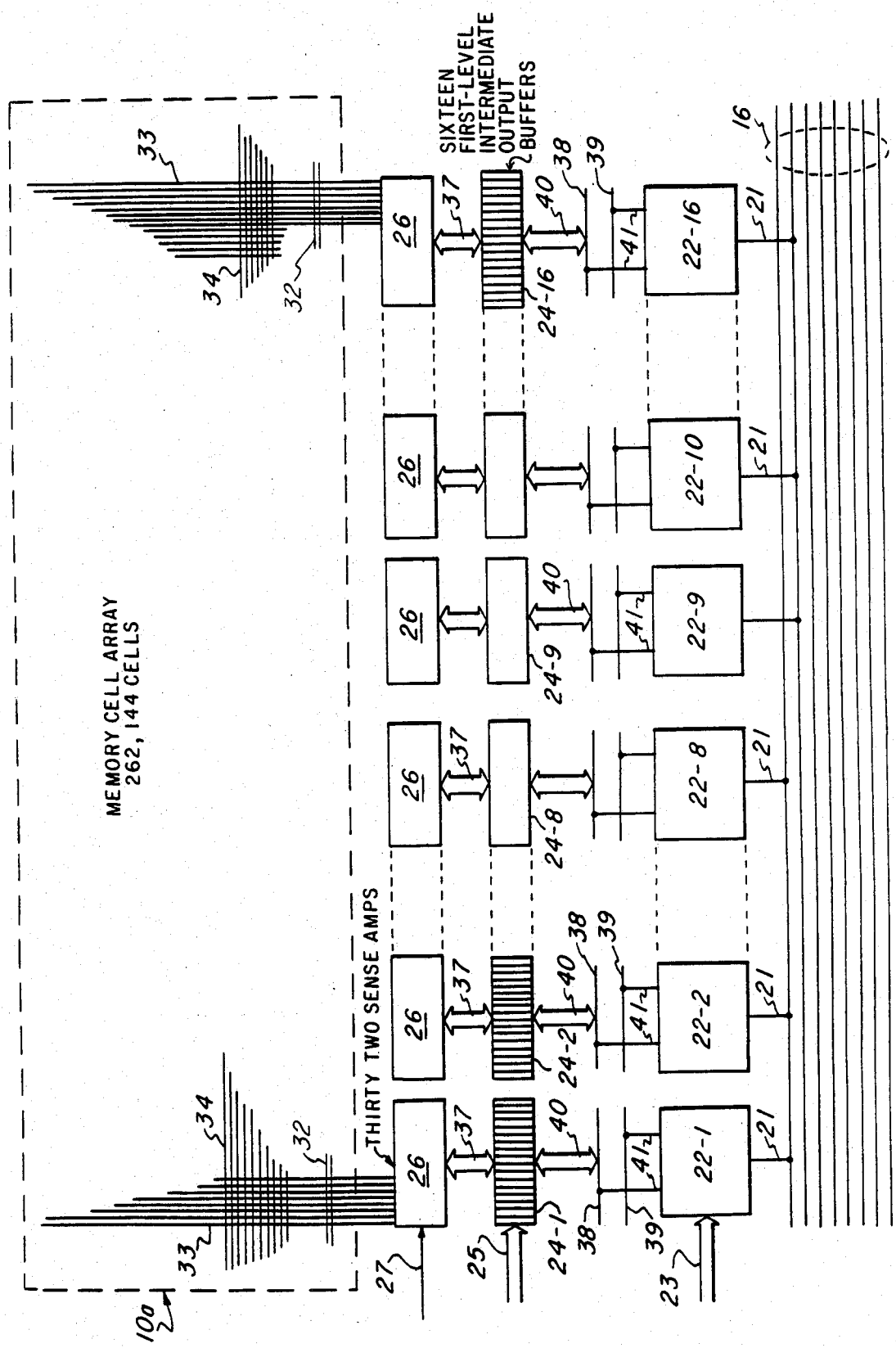
FIG. 2 is an electrical diagram in block form of a part of the memory device of FIG. 1.

Referring to FIG. 2, the I/O lines 16, the intermediate output buffers 22 and 24, and the sense amlifiers 26 are shown in more detail for a part of one of the blocks 10a–10d. In a given block, there are sixteen of the intermediate output buffers 22, in this figure labelled 22-1 . . . 22-16. Note that buffers 22-1 through 22-8 are in one group of eight associated with one of the lines 16 for this block, and the buffers 22-9 through 22-16 are in another group of eight connected with the other one of the lines 16 for this block by lines 21. For each one of the sixteen buffers 22-1 . . . 22-16, there is a set of sixteen buffers 24; here these sets are labelled 24-1 through 24-16 (sixteen in each set). For each set of sixteen buffers 24, a group of thirty-two sense amplifiers 26 is provided, and each sense amplifier 26 is connected to two of the bit lines 33 (one column equals two bit lines, or two column line halves). This connection may be shifted to the left or right in a test mode, as set forth below. Intersecting the bit lines 33 are 512 row lines 34 in the memory cell array. The dummy row lines 32 also intercept the bit lines 33, as will be described. One of the two dummy lines is selected by the row decoder 11a, 11b using one bit of the nine-bit row address 14.

The tenth bit of the row address from buffers 13 is applied by the line 27 to a multiplex circuit for the sense amplifiers 26 to select which one of the two sense amplifiers of each pair is connected to the respective buffer 24 by lines 37. There are sixteen pairs of data/data-bar lines 38 and 39 in this block, each pair being coupled to the selected buffers 24 on one side by lines 40 and connected to the selected buffers 22 on the other side by lines 41. Note that the I/O changes from double-rail at the lines 38 and 39 to single rail at the data I/O lines 16, for a write operation, in accordance with the invention of copending application Ser. No. 626,791, filed July 2, 1984, by Ken A. Poteet, assigned to Texas Instruments.

Figure 3:
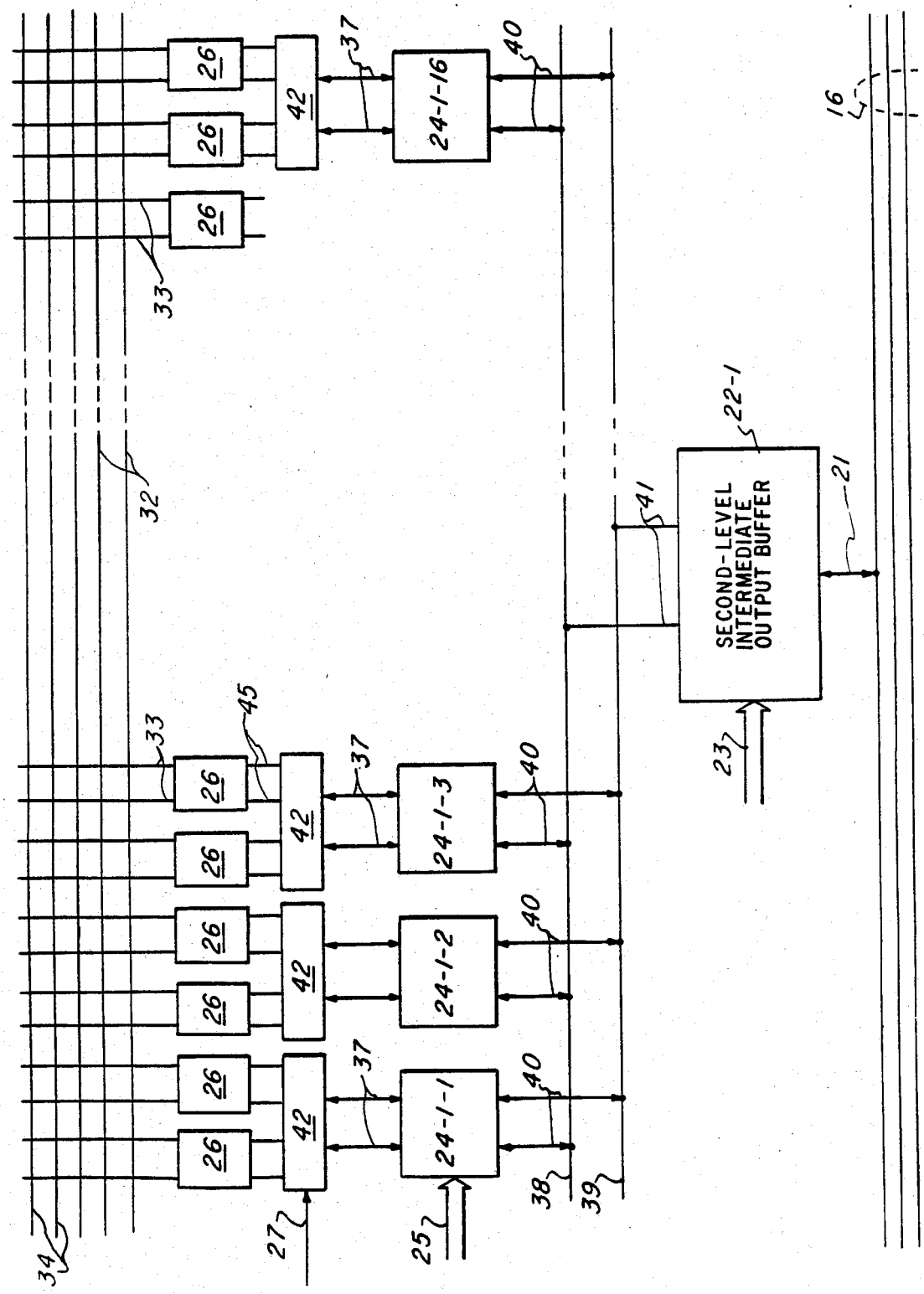
FIG. 3 is an electrical diagram in block form of a part of the circuitry of FIG. 2.

Referring to FIG. 3, a part of the circuitry of FIG. 2 is shown in more detail. The sense amplifiers 26 associated with the set of sixteen buffers 24-1 are shown. There are actually thirty-two sense amps 26 for this set. This set of sixteen buffers 24-1 is labelled 24-1-1 through 24-1-16 in this figure. Each individual sense ampliier 26 has two bit lines 33 extending from it, in the so-called folded bit line configuration. Thus, all row lines 34 and both dummy rows 32 are on the sme side of the sense amp. The row lines 34 intersect the bit lines, and memory cells are at intersections of row lines and bit lines. A multiplexer 42 for each pair of sense amplifiers 26 select one, based on the address bit on line 27, for connection to the respective buffer 24-1-1, 24-1-2, etc., by lines 37. Only one of the sixteen buffers 24-1-1 through 24-1-16 is selected at any one time, based on the four column address bits lin lines 25, so only one will be operative to couple a read-or-write bit of data to or from the lines 38, 39 by lines 40. The buffer 22-1 of FIG. 3 may or may not be selected by the 2-of-16 select provided by three bits on lines 23, for coupling the dual-rail I/O lines 38, 39 to the single rail I/O line 16 for this group.

Figure 4:
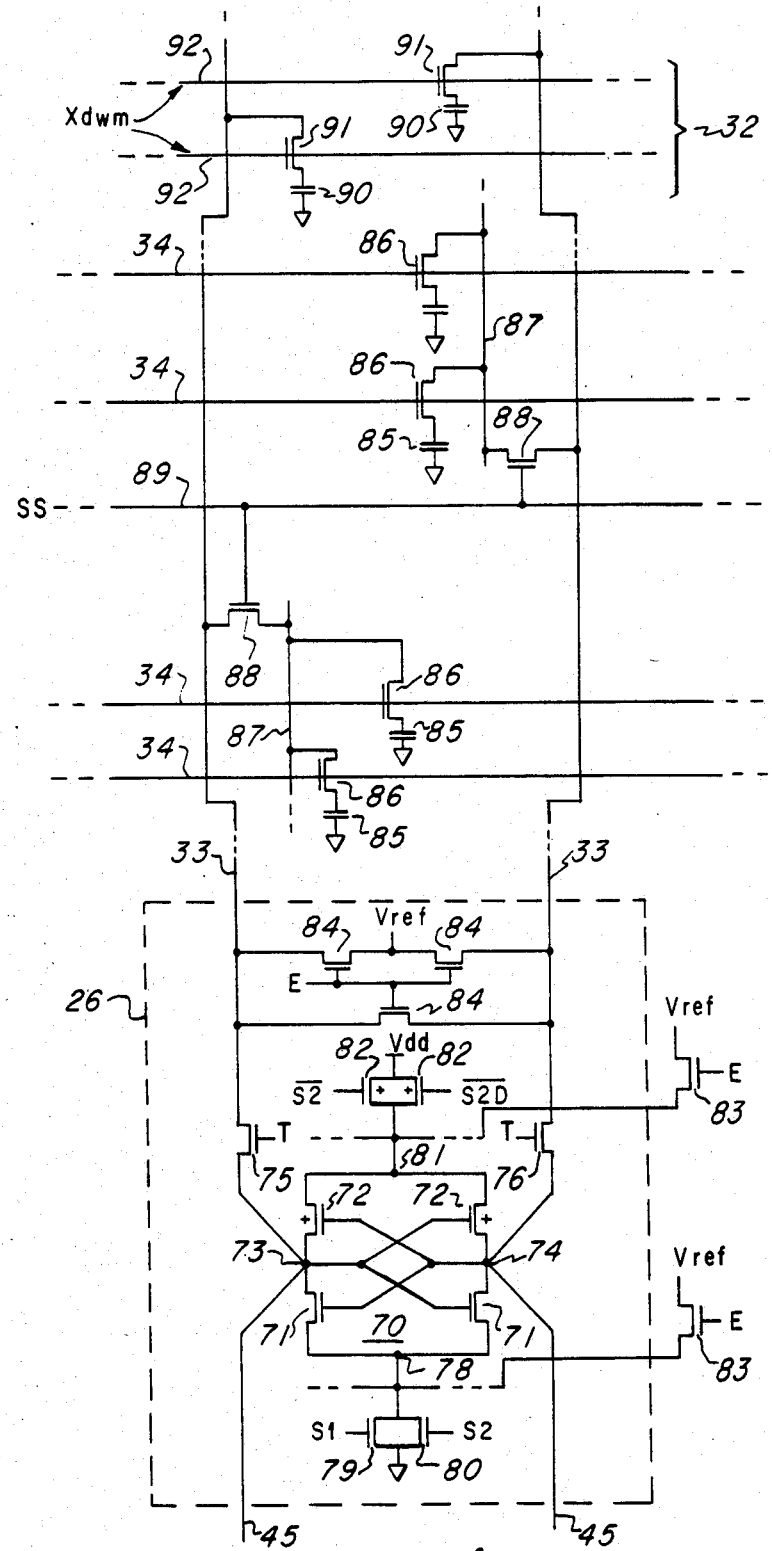
FIG. 4 is an electrical diagram in schematic form of the sense amplifier and cell array in the device of FIGS. 1–3.

Referring to FIG. 4, one of the sense amplifiers 26 is shown in detail. This figure also shows the two bit lines 33 for this sense amplifier and four of the 512 row lines 34 perpendicular to these bit lines. The sense amplifier employs a CMOS cross-coupled flip-flop 70 having N-channel driver transistors 71 and P-channel transistors 72. Sense nodes 73 and 74 are connected to bit lines 33 through the source-drain paths of isolating transistors 75 and 76, as explained in copending application Ser. No. 639,941, filed Aug. 2, 1984 by Charvaka Duvvury and Adin Hyslop, assigned to Texas Instruments. A node 78 on the ground side of the flip-flop 70 is coupled to ground through two N-channel transistors 79 and 80, which have sense clocks S1 and S2 on their gates. The transistor 79 is much smaller than the transistor 80, and clock S1 occurs first, so the initial sensing is at a lower-gain condition, and is performed by N-channel transitors 71. On the Vdd side, a node 81 is coupled to the supply through P-channel transistors 82, one of which has sense clock $\overline{S2}$ on its gate and the other a delayed clock $\overline{S2D}$ on its gate. The sense clock $\overline{S2}$ is the complement of S2, so the P-channel transistors 72 start to operate only after the second clock S2 is activated. There is a two-interval sense operation, first S1, then S2 and $\overline{S2}$. The transistor pairs 79, 80 and the transistors 82, are shared with all of the other sense amplifiers 26 in two blocks 10a and 10b, i.e., 1024 sense amplifiers. The node 78 is precharged to about one-half Vdd by a transistor 83 when E is high.

The bit lines 33 are precharged and equalized through three transistors 84 which have an equalize clock voltage E on their gates; one of these transistors 84 shorts the bit lines, and two have their sources connected to a reference voltage Vref. The value of this reference voltage is about half Vdd, so little or no net charge is needed from the chip supply Vdd to precharge all of the bit lines. That is, one line 33 will be high and the other low for each sense amplifier, so one will charge the other, and Vref need only supply any differential that might have occurred. The clock E is generated in the control circuitry 31 after the end of an active cycle, when $\overline{RAS}$ goes high.

Each of the memory cells consists of a capacitor 85 and an access transistor 86, with the gates of all of the 512 access transistors 86 in a row being connected to a row line 34. Only one row line 34 of 512 in the block is turned on at any one time, so only one memory cell capacitor 85 is connected to a bit line 33 for a given sense amplifier 26. According to the invention of application Ser. No. 634,901, filed July 26, 1984 by David J. McElroy, assigned to Texas Instruments, in order to reduce the ratio of the bit line capacitance to the value of the storage capacitance 85, a number of bit line segments 87 are employed for each pair of bit lines 33. One of these segments 87 is coupled to a bit line 33 at a given time by one of the transistors 88. For example, each segment 87 may have thirty-two cells connected to it, so in the embodiment disclosed herein there must be sixteen of these segments 87 for each sense amplifier (16×32=512). Half of the segments are connected to one bit line and half to the other. The row decoder 11a or 11b selects the appropriate one of eight lines 89 by a segment select voltage SS, at the same time as this decoder selects 1-of-512 row lines 34, based on certain ones of the same nine address bits from lines 14.

In the dummy rows 32, a pair of dummy cells are provided for each pair of bit lines 33, and these dummy cells consist of dummy capacitors 90 and access transistors 91. When the selected storage cell is on the left-hand bit line 33, then the right-hand dummy cell is selected in the row decoders 11a, 11b by one of the decoder output lines 92, and vice versa, in the usual manner. One bit of the row address is used in the row decoder to select one or the other of these lines 92 of the dummy cell rows 32.

Figure 5:
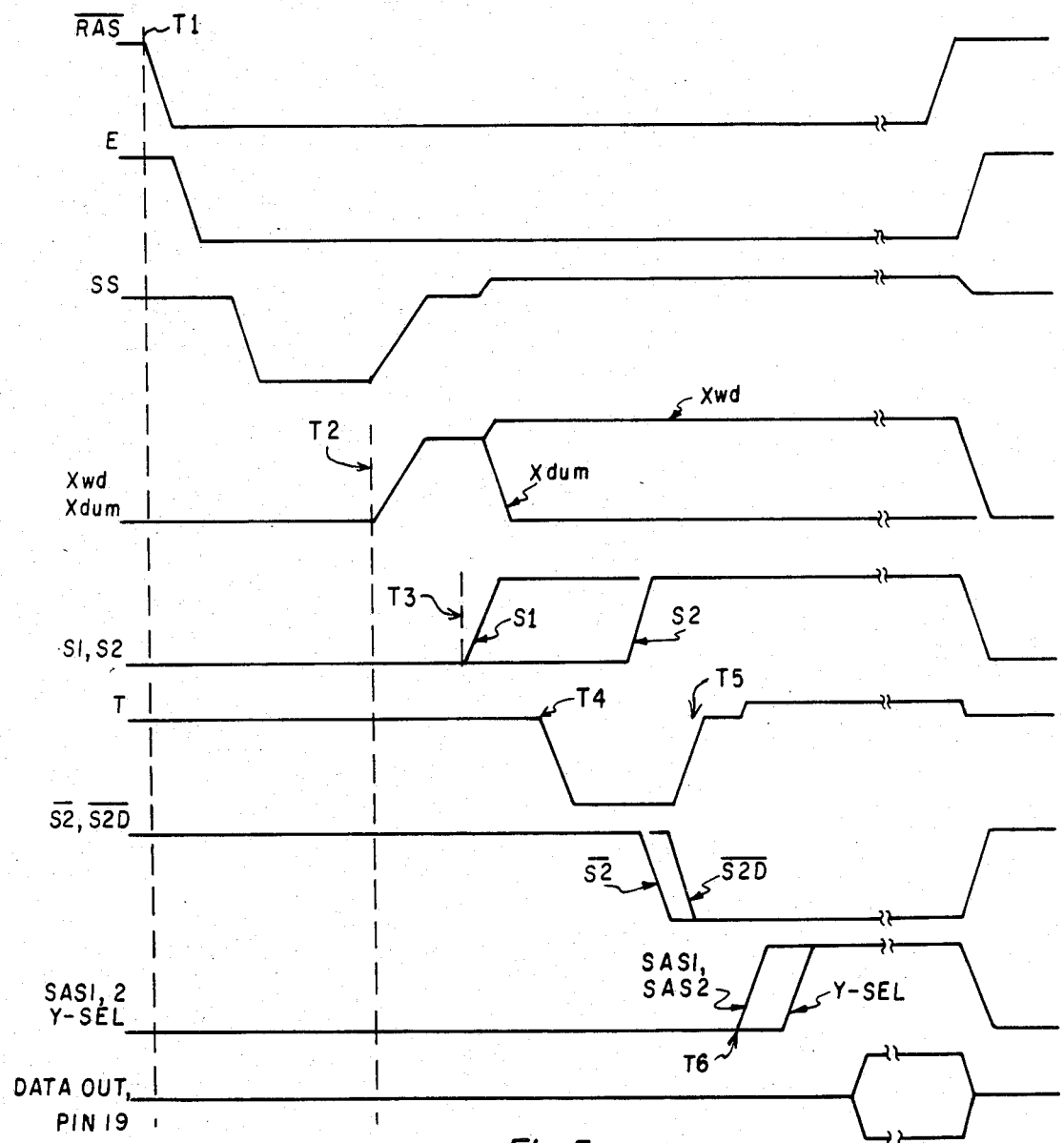
FIG. 5 is a timing diagram showing voltage vs. time for various nodes in the circuit of FIGS. 1–4.

Referring to FIG. 5, the sequence of operation of the memory device will be explained for a single-bit read operation. An active cycle begins with the $\overline{RAS}$ voltage dropping from =to zero at the time TO. This example is a read cycle, so at time TO the R/$\overline{W}$ input voltage is at +5. The time prior to TO is a precharge cycle, during which the equalize voltage E has been high, so all of the bit lines 33 and the nodes 78, have been precharged to the Vref voltage, assumed to be about ½ Vdd or +2.5. The segment select signal SS on all lines 89 is also held high during the precharge cycle, so all of the segments 87 are also precharged to the Vref voltage. The dropping of RAS at TO causes the equalize voltage E to drop, isolating the pairs of bit lines 33 from each other and from Vref. The segment select signal SS then drops, isolating all of the segments 87 from the bit lines 33. As soon as the row decoders 11a, 11b have had time to respond to the row address, at time T1 the Xwd and Xdum voltages start to rise on the selected 1-of-512 row line 34 and selected 1-of-2 dummy line 92; at the same time T1, the segment-select signal SS on one of the lines 89 is brought up. These address voltages Xwd, Xdum and SS are brought up rather slowly, and after reaching the Vdd level, SS and Xwd are boosted above Vdd to eliminate the Vt drop across the access transistors 86 and 88. The Xdum voltage falls, since the function of the dummy cells is completed during initial sensing, and the dummy capacitors can be decoupled from the bit lines so these capacitors can be precharged, as disclosed in copending application Ser. No. 630,507, filed July 11, 1984 by Tran, McAdams and Childers, assigned to Texas Instruments. At time T2, the sense amplifiers 26 are first activated by the S1 voltage going high, turning on the high-impendence N-channel transistor 79; this begins to separate the bit lines 33 further than the separation caused by the differential voltages on the storage cell and dummy cell. But before any current flows from the supply Vdd through transistors 72, the T voltage falls at T3, isolating the bit lines 33 from the sense nodes 73 and 74. After the T voltage falls, the sense voltage S2 is brought up, so the large transistor 82 begins to conduct. After S2 rises and $\overline{S2}$ drops at T4, the T voltage is brought up to Vdd. At time T5 after the isolating transistors 75, 76 have been turned back on, sensing is complete and one bit line 33 is high and the other zero, so the sense-amp-select voltage SAS1 or SAS2 (selected by address bit 27) is turned on, connecting one of the bit lines to a buffer 24 via lines 37 of FIG. 3, using the multiplexer 42. Just after this the Y-select outputs from column decoders are valid, so the selected data bit becomes valid on the line 16, and shortly thereafter the data bit is valid on the output pin 19.

For a refresh operation, the function is exactly the same as described for a read operation, except there is no Y output. The SAS1, SAS2 and Y-sel signals do not occur, and the data output pin 19 stays at a high impedence level.

Figure 6:
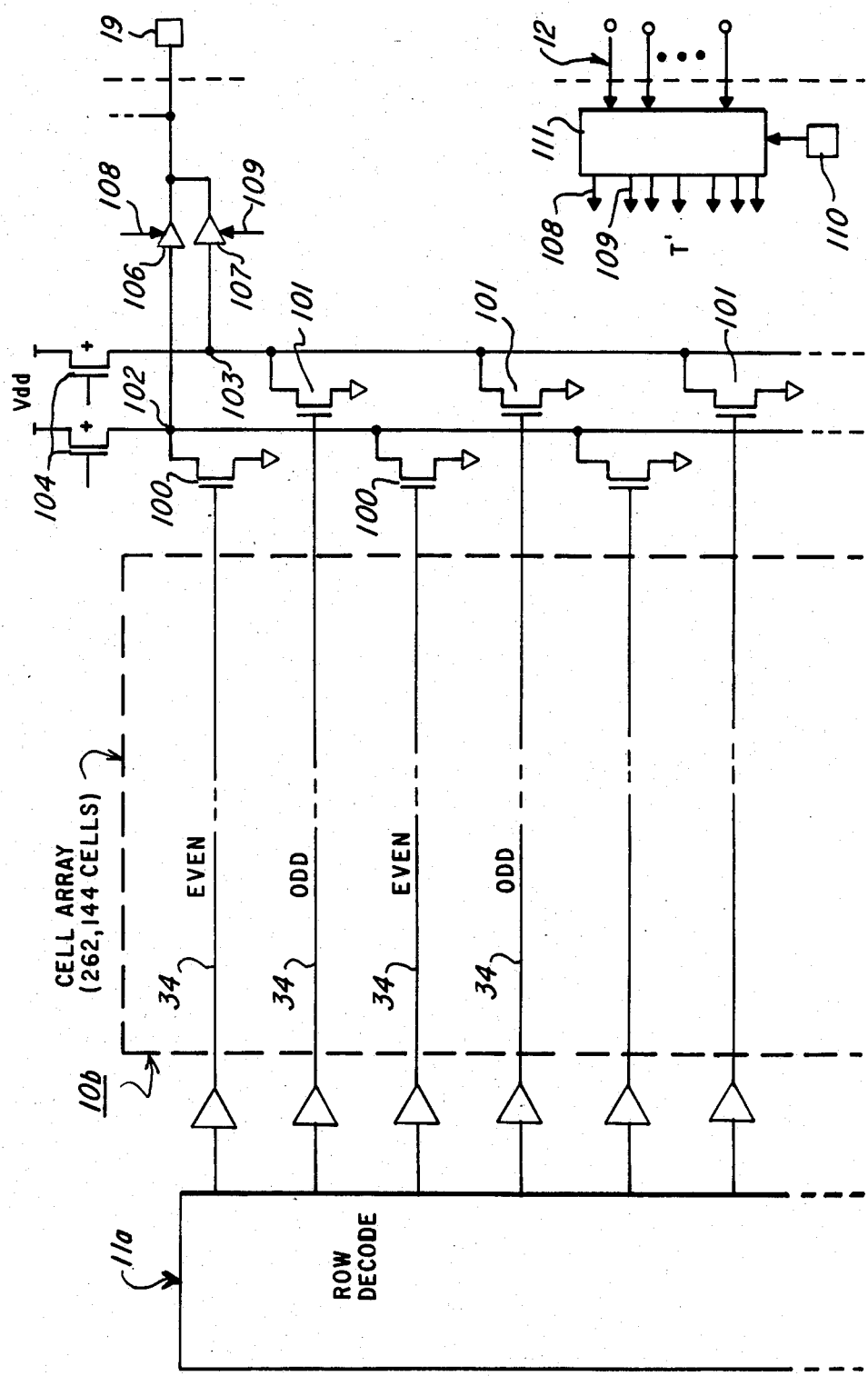
FIG. 6 is an electrical diagram in schematic form of row address circuitry in the device of FIGS. 1–4 adapted for a test mode of operation.

With reference to FIG. 6, according to one embodiment of the invention, the circuitry for driving the row lines 34 in each of the arrays 10a, 10b, 10c and 10d from the outputs of the row decoders 11a and 11b is of standard construction, but detector circuits are added at the ends of the row lines, to be used only in a test mode. Each one of the even-numbered row lines 34 has a transistor 100 at the end, and each one of the odd-numbered row lines 34 has a transistor 101 at the end. The row lines pass through their entire array blocks 10a, 10b, etc. before reaching the gates of their respective detector transistors 100 or 101, and so if there is a short or open circuit in a row line it can be detected by these transistors. All of the 1024 even-numbered row lines (512×½×4=1024) are connected to a common output node 102, and all 1024 odd-numbered connected to an output node 103. These nodes 102 and 103 are precharged by transistors 104 in a precharge cycle, then conditionally discharged through the detector transistors 100 and 101 during an active cycle in test mode. The nodes 102 and 103 are selectively coupled to the data output terminal 19 by buffers 106 and 107 activated by test signals 108 and 109. In this manner, a test operation would include first charging the nodes 102 and 103 high in a precharge cycle (i.e., before $\overline{RAS}$ falls) while all of the lines 34 are low, then starting a cycle similar to a standard read or refresh cycle in which a row address is gated in through buffers 13 or from an internal refresh address counter, driving one row line 34 high. The corresponding buffer 106 or 107 then is activated by a test signal 108 or 109, depending upon whether the input row address is odd or even, and the output data bit on pin 19 is observed by the test machine. The data bit accessed through the circuitry of FIG. 2 or 3 or ordinary operation modes is blocked (as by disabling the I/O buffers 22, for example). If the data bit on pin 19 stays high, there must be an open circuit in the row line 34 for this bit, or the decoder or driver for the addressed row line contains a fault. Identifying a row having a short to Vss or Vdd requires cycling through all rows to eliminate all others. A short between two adjacent row lines will pull both adjacent lines low when only one is addressed, and this can be detected at the data output 19 using an appropriate address sequence.

Figure 7:
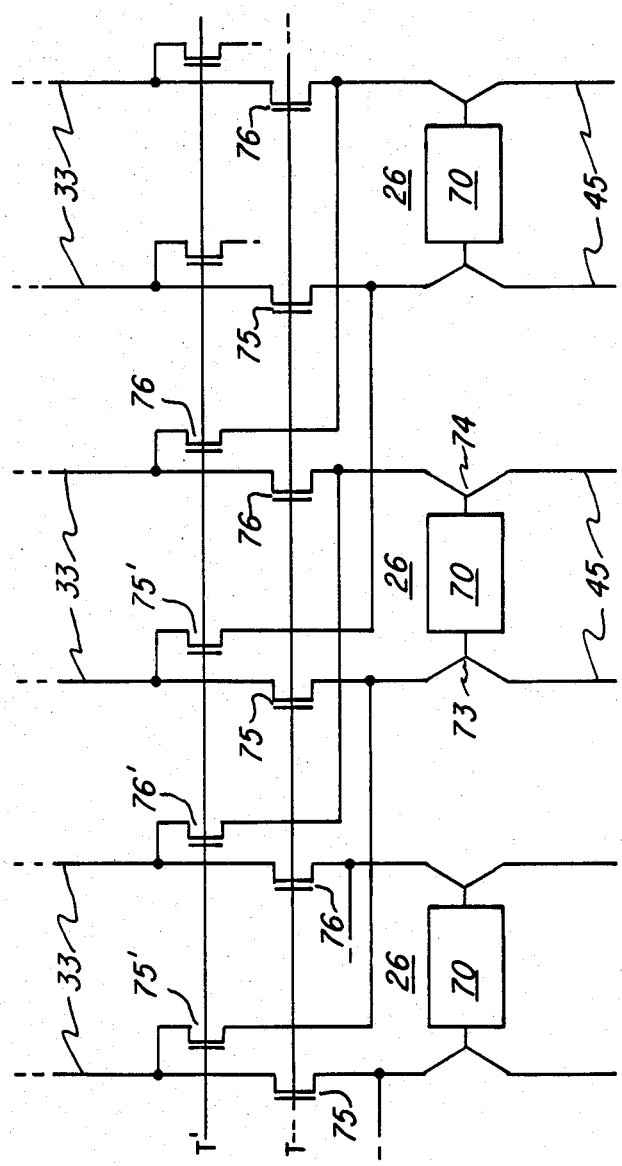
FIG. 7 is an electrical diagram in schematic form of column transposing circuitry for FIG. 4, for a test mode of operation.

Referring to FIG. 7, testing circuitry is illustrated according to another embodiment of the invention for isolating column failures, or shifting test patterns through the array. In each one of the sense amplifier circuits 26, additional sets of the coupling transistors 75 and 76 are included in the circuit of FIG. 7 to connect the CMOS latch 70 to an adjacent pair of bit lines 33 instead of to the pair with which this latch is aligned. That is, a set of transistors 75' and 76' couples the nodes 73 and 74 of latch 70 to the pair of bit lines 33 on the left, if a coupling voltage T' occurs instead of the voltage T. In standard operation; only T occurs, never T'. In a test mode, a standard series of test patterns is run on a test machine, with the device at a multiprobe test station, for example. Based on the results of the standard tests, if it appears that a column failure is occurring, then a test pattern is re-run with a test mode entered in which T' is used instead of the T voltage, so every sense amplifier is connected to the adjacent column instead of the original column. Or, the test pattern may be localized to the area of the detected fault, to save time, instead of using all of the column addresses. If the fault shows up for the same column address as before, then the sense amplifier is failing instead of the column of cells or the bit lines, whereas if the address of the fault shifts by one then the fault is not in the sense amplifier circuitry but instead is in the bit lines or cells. The exact type of fault is thus more accurately identified. The first column in a block will show bad data for this test because there is no adjacent column or sense amplifier, but this will be only a very minor percentage of the total columns.

Another mode of test operation using the circuit of FIG. 7 is to write a data pattern into the first row in the array, then repeat this pattern in all 512 other rows without using a complete write cycle by shifting the data along the columns using the coupling transistors T'. This may be done by using the on-chip refresh address counter to cycle through the 512 row addresses while applying column addresses from external in a short cycle, or from an on-chip column address counter to save time.

The test modes of operation are established by a special input condition which would not occur in normal operation. The test modes are entered only in the manufacturing test procedures. For example, while the slice is at a multiprobe station, before being broken into individual chips, a test pad 110 of FIG. 6 may be activated by an electrical probe; this pad 110 would not be one of the bonding pads used for input or output of addresses, data or controls in normal operation. Alternatively, an over-voltage condition on one of the terminals used in normal operation may be used to trip a test control circuit when at the test station. The test control circuit 111 as seen in FIG. 6 detects this condition, and then is responsive to the address pins 12 to determine which of the test modes is to be implemented. Depending upon the address bits applied, the circuit 111 generates the controls 108 and 109 for the row test, or the signal T' (replacing T) of FIG. 7. A control 112 may also be generated to disable the precharge of FIG. 6 so the detector transistors are removed from the circuit during normal operation to avoid unnecessary current drain, although this would be minor.

When this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A semiconductor memory device comprising:
   an array of rows and columns of storage cells, and row lines coupled to all cells in each row,
   addressing means for selectively activating said rows of storage cells,
   and testing means for testing the operation of said rows including:
   two separate sets of logic circuit means, one for each set of separate alternating row lines to detect the activation thereof and to produce one of two distinct outputs from the device,
   and separate means for enabling or disabling said two separate logic circuit means in response to two test control inputs to the device.

2. A device according to claim 1 wherein said logic circuit means is located connected to row lines on an opposite end of said array from said addressing means.

3. A device according to claim 1 wherein said logic circuit means includes first means coupled to a first set of said row lines and second means coupled to a second set of said row lines.

4. A device according to claim 3 wherein said first and second sets are interleaved odd and even numbered row lines.

5. A device according to claim 4 including means for separately coupling said first and second means to said output.

6. A device according to claim 5 wherein said first and second means include first and second sets of transistors each having a gate coupled to one of said row lines.

7. A method of testing a semiconductor memory device or the like having rows and columns of cells, with row lines coupled to rows of cells, comprising the steps of:
   addressing said row lines in a sequence by applying a voltage to a selected row line,
   detecting the voltage applied to said selected row line when addressed, and distinguishing between selection of adjacent row lines,
   producing an output from said device indicating the value of voltage detected, said output being different from a data output from the device used in normal operation.

8. A method according to claim 7 wherein the step of detecting includes the step of:
   alternately detecting the voltage on adjacent row lines by first and second detector means.

9. A method according to claim 8 wherein said first and second detector means are connected respectively to all even or odd row lines in the array.

10. A method according to claim 8 including the step of separately coupling the outputs of said first and second detector means to an output terminal of said device.

11. A method according to claim 10 wherein said cells are dynamic read/write memory cells.

12. A method according to claim 10 including the step of disabling input or output of data at said output terminal through coupling means used in normal operation of the device, when in a test mode of operation.

* * * * *